US008713387B2

(12) United States Patent
Johnson et al.

(10) Patent No.: US 8,713,387 B2
(45) Date of Patent: *Apr. 29, 2014

(54) CHANNEL MARKING FOR CHIP MARK OVERFLOW AND CALIBRATION ERRORS

(71) Applicant: International Business Machines Corporation, Armonk, NY (US)

(72) Inventors: Judy S. Johnson, Poughkeepsie, NY (US); Luis A. Lastras-Montano, Cortlandt Manor, NY (US); Patrick J. Meaney, Poughkeepsie, NY (US); Eldee Stephens, Waterbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/658,148

(22) Filed: Oct. 23, 2012

(65) Prior Publication Data
US 2013/0047040 A1 Feb. 21, 2013

Related U.S. Application Data

(63) Continuation of application No. 12/981,017, filed on Dec. 29, 2010.

(51) Int. Cl.
*G11C 29/00* (2006.01)
*G06F 11/00* (2006.01)

(52) U.S. Cl.
USPC .......................................... 714/723; 714/708

(58) Field of Classification Search
USPC .............................. 714/723, 48, 708, 718, 799
See application file for complete search history.

(56) References Cited

U.S. PATENT DOCUMENTS

| 3,975,715 | A | | 8/1976 | Hutner | |
|---|---|---|---|---|---|
| 4,016,549 | A | | 4/1977 | Hutner | |
| 5,463,643 | A | * | 10/1995 | Gaskins et al. | 714/766 |
| 6,480,982 | B1 | * | 11/2002 | Chan et al. | 714/764 |
| 6,529,979 | B1 | * | 3/2003 | Floyd et al. | 710/105 |
| 7,130,967 | B2 | * | 10/2006 | Arimilli et al. | 711/137 |
| 7,523,364 | B2 | * | 4/2009 | Alves et al. | 714/710 |
| 7,734,980 | B2 | | 6/2010 | Alexander et al. | |
| 7,840,398 | B2 | * | 11/2010 | Zimmer et al. | 703/23 |
| 8,041,989 | B2 | | 10/2011 | Lastras-Montano et al. | |
| 2002/0066052 | A1 | * | 5/2002 | Olarig et al. | 714/42 |
| 2006/0277434 | A1 | * | 12/2006 | Tsern et al. | 714/17 |
| 2007/0011562 | A1 | * | 1/2007 | Alexander et al. | 714/758 |
| 2007/0089032 | A1 | * | 4/2007 | Alexander et al. | 714/763 |
| 2007/0162715 | A1 | * | 7/2007 | Tagawa | 711/158 |
| 2009/0006900 | A1 | * | 1/2009 | Lastras-Montano et al. | 714/42 |

(Continued)

OTHER PUBLICATIONS

PCT International Written Opinion and Search Report for International Application PCT/EP2011/072734 from the International Searching Authority, mailed May 7, 2012, 16 pgs.

(Continued)

*Primary Examiner* — Cynthia Britt
(74) *Attorney, Agent, or Firm* — Cantor Colburn LLP; John Campbell

(57) ABSTRACT

Marking memory chips as faulty when a fault is detected in data from the memory chip. Upon detecting that a plurality of memory chips are faulty, determining which of a plurality of memory channels contains the faulty memory chips. Marking one of a plurality of memory channels as failing in response to determining that the number of failing memory chips has exceeded a threshold.

11 Claims, 10 Drawing Sheets

(56) References Cited

U.S. PATENT DOCUMENTS

| | | |
|---|---|---|
| 2009/0025027 A1 | 1/2009 | Craner |
| 2009/0164837 A1* | 6/2009 | Swanson et al. ............ 714/6 |
| 2009/0228755 A1 | 9/2009 | Franovici |
| 2010/0005366 A1 | 1/2010 | Dell et al. |
| 2010/0162037 A1* | 6/2010 | Maule et al. ............ 714/5 |
| 2010/0293410 A1 | 11/2010 | Bland et al. |
| 2012/0173936 A1* | 7/2012 | Johnson et al. ............ 714/718 |
| 2013/0047040 A1 | 2/2013 | Johnson et al. |

OTHER PUBLICATIONS

U.S. Appl. No. 12/981,017, filed Dec. 29, 2010; Non-Final Office Action dated Oct. 1, 2013, 12 pages.

* cited by examiner

| MARKS \ NEW ERRORS | NO MARKS | SINGLE CHIP MARKED | TWO CHIPS MARKED | CHANNEL MARKED | SINGLE CHIP & CHANNEL MARKED | DOUBLE CHIP & CHANNEL MARKED |
|---|---|---|---|---|---|---|
| NONE | GOOD | GOOD | GOOD | GOOD | GOOD | GOOD |
| 1 CHIP/1 BIT | CE | CE | CE | CE | CE | CE |
| 1 CHIP/>1 BIT | CE | CE | CE | UE | CE | UE |
| 2 CHIPS, SAME CHANNELS | CE | UE | UE | UE | UE | UE (99.99999%) |
| 2 CHIPS, DIFFERENT CHANNELS | UE | CE | CE | UE | UE | UE (99.99999%) |
| FULL CHANNEL ERRORS (CRC) | CE | CE | CE | UE | UE | UE |

FIG. 5

PORT 0 DRAM MARKS

| STACK ENTRY | SLOT | RANK | DATA | MARK X (CHAN/CHIP) | MARK Y (CHAN/CHIP) |
|---|---|---|---|---|---|
| ENTRY0 | 0 | 0 | 00000000000 | | |
| ENTRY1 | 0 | 1 | 00000000000 | | |
| ENTRY2 | 0 | 2 | 00000000000 | | |
| ENTRY3 | 0 | 3 | 00000000000 | | |
| ENTRY4 | 0 | 4 | 00000000000 | | |
| ENTRY5 | 0 | 5 | 00000000000 | | |
| ENTRY6 | 0 | 6 | 00000000000 | | |
| ENTRY7 | 0 | 7 | 00000000000 | | |
| ENTRY8 | 1 | 0 | 1F38851FF00 | 3/6 | 0/6 |
| ENTRY9 | 1 | 1 | F6B30000400 | 4/5 | |
| ENTRY10 | 1 | 2 | 00000000000 | | |
| ENTRY11 | 1 | 3 | F6B30000400 | 4/5 | |
| ENTRY12 | 1 | 4 | 00000000000 | | |
| ENTRY13 | 1 | 5 | 00000000000 | | |
| ENTRY14 | 1 | 6 | 00000000000 | | |
| ENTRY15 | 1 | 7 | 00000000000 | | |

PORT 1 DRAM MARKS

| STACK ENTRY | SLOT | RANK | DATA | MARK X (CHAN/CHIP) | MARK Y (CHAN/CHIP) |
|---|---|---|---|---|---|
| ENTRY0 | 0 | 0 | 00000000000 | | |
| ENTRY1 | 0 | 1 | 00000000000 | | |
| ENTRY2 | 0 | 2 | 00000000000 | | |
| ENTRY3 | 0 | 3 | 00000000000 | | |
| ENTRY4 | 0 | 4 | 00000000000 | | |
| ENTRY5 | 0 | 5 | 00000000000 | | |
| ENTRY6 | 0 | 6 | 00000000000 | | |
| ENTRY7 | 0 | 7 | 00000000000 | | |
| ENTRY8 | 1 | 0 | F3B30000400 | 4/5 | |
| ENTRY9 | 1 | 1 | F3B30000400 | 4/5 | |
| ENTRY10 | 1 | 2 | 00000000000 | | |
| ENTRY11 | 1 | 3 | F6B30000400 | 4/5 | |
| ENTRY12 | 1 | 4 | 00000000000 | | |
| ENTRY13 | 1 | 5 | 00000000000 | | |
| ENTRY14 | 1 | 6 | 00000000000 | | |
| ENTRY15 | 1 | 7 | 00000000000 | | |

*FIG. 6A*

| DRAM SELECTS | CHANNEL 0 | CHANNEL 1 | CHANNEL 2 | CHANNEL 3 | CHANNEL 4 |
|---|---|---|---|---|---|
| CHIP 0 | 0x8000 | 0x4000 | 0x2000 | 0x1000 | 0xF000 |
| CHIP 1 | 0x82C3 | 0x416D | 0x2C3A | 0x16D5 | 0xF941 |
| CHIP 2 | 0x8CAF | 0x465B | 0x23E9 | 0x1D78 | 0xF465 |
| CHIP 3 | 0x83F1 | 0x4DBC | 0x2A96 | 0x1583 | 0xF158 |
| CHIP 4 | 0x8D93 | 0x4A8D | 0x254A | 0x1E25 | 0xFC71 |
| CHIP 5 | 0x8A45 | 0x452E | 0x2E17 | 0x17CF | 0xF6B3 |
| CHIP 6 | 0x851F | 0x4ECB | 0x2769 | 0x1F38 | 0xF385 |
| CHIP 7 | 0x8E68 | 0x4734 | 0x2FD2 | 0x1BA1 | 0xFD2F |
| CHIP 8 | 0x87D1 | 0x4FAC | 0x2B56 | 0x19E3 | 0xFAC8 |

*FIG. 6B*

CHANNEL MARKING FOR CHIP MARK OVERFLOW AND CALIBRATION ERRORS

CROSS-REFERENCE TO RELATED APPLICATION

This application is a continuation of U.S. patent application Ser. No. 12/981,017, filed Dec. 29, 2010, the content of which is hereby incorporated by reference in its entirety.

BACKGROUND

This invention relates generally to computer memory and more particularly, to channel marking for chip mark overflow and calibration errors in a memory system.

Memory device densities have continued to grow as computer systems have become more powerful. With the increase in density comes an increased probability of encountering a memory failure during normal system operations. Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. If there is a single error present in the data word during a read operation, it can be detected by regenerating parity from the data and then checking to see that it matches the stored (originally generated) parity.

Richard Hamming recognized that the parity technique could be extended to not only detect errors, but to also correct errors by appending an XOR field, an error correction code (ECC) field, to each data, or code, word. The ECC field is a combination of different bits in the word XOR-ed together so that some number of errors can be detected, pinpointed, and corrected. The number of errors that can be detected, pinpointed, and corrected is related to the length of the ECC field appended to the data word. ECC techniques have been used to improve availability of storage systems by correcting memory device (e.g., dynamic random access memory or "DRAM") failures so that customers do not experience data loss or data integrity issues due to failure of a memory device.

Redundant array of independent memory (RAIM) systems have been developed to improve performance and/or to increase the availability of storage systems. RAIM distributes data across several independent memory modules (each memory module contains one or more memory devices). There are many different RAIM schemes that have been developed each having different characteristics, and different pros and cons associated with them. Performance, availability, and utilization/efficiency (the percentage of the disks that actually hold customer data) are perhaps the most important. The tradeoffs associated with various schemes have to be carefully considered because improvements in one attribute can often result in reductions in another.

One method of improving performance and/or reliability in memory systems is to "mark" individual memory chips as potentially faulty. In addition, when an entire memory channel fails, the channel itself can be marked as faulty. Channel marking is a way of ignoring a single channel (one out of five) during the ECC decoding and correcting phase of a fetch to improve correctability of the data. The intent of this channel mark is to guard against detected catastrophic channel errors, such as bus errors that cause bad cyclic redundancy check (CRC) or clock problems using software and/or hardware logic.

The software and/or hardware logic also supports two DRAM chip marks which are applied on a per-rank basis to guard against bad chips. These DRAM marks are used to protect the fetch data against chip kills (those chips that have severe defects). However, if there is an overabundance of DRAM errors in a rank, the DRAM marks may not be sufficient to repair the chip errors. This increases the possibility for uncorrectable errors if additional chips fail after the two chips of that rank are marked.

In addition, certain calibration errors can cause a high rate of channel errors which could lead to uncorrectable errors. If this happens, any number of DRAMs may be affected causing DRAM mark availability to be limited.

SUMMARY

An embodiment is a computer implemented method that includes detecting that a plurality of memory chips are faulty. The method further includes determining which of a plurality of memory channels contains the faulty memory chips. Once the faulty memory chips are mapped to the memory channels, the method includes marking one of a plurality of memory channels as failing in response to determining that a number of failing memory chips has exceeded a threshold.

BRIEF DESCRIPTION OF THE DRAWINGS

Referring now to the drawings wherein like elements are numbered alike in the several FIGURES:

FIG. 5 illustrates a table of error coverage in an embodiment;

FIG. 6A illustrates entries in a marking table in an embodiment;

FIG. 6B illustrates address mapping entries in a hardware table in an embodiment;

DETAILED DESCRIPTION

Figure 1:
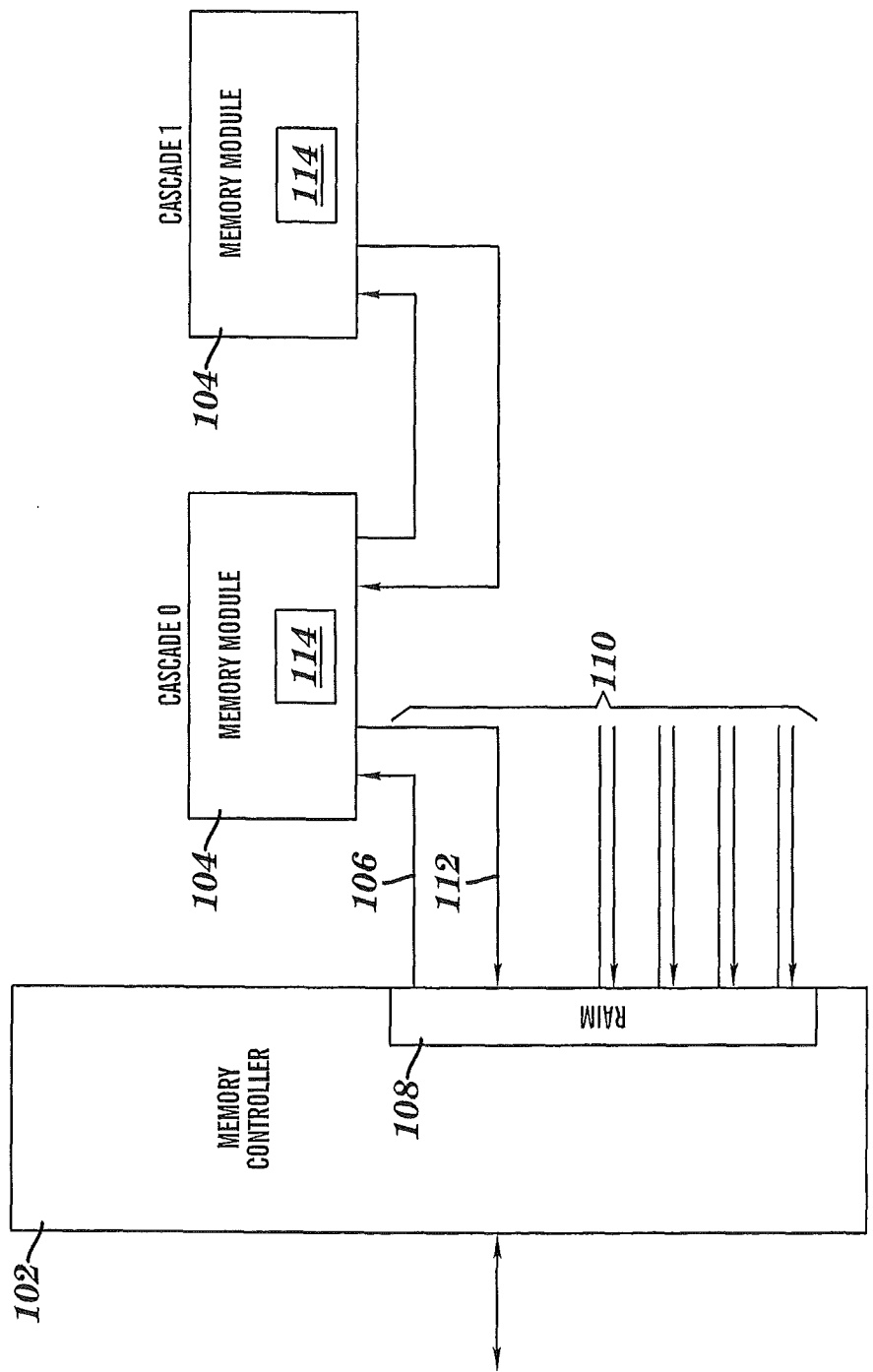
FIG. 1 illustrates a block diagram of a cascade interconnect memory system that may be implemented by an embodiment.

An exemplary embodiment of the present invention provides improved data protection in a redundant array of independent memory (RAIM) system by marking an entire memory channel when the number of bad chips exceeds the maximum correctable chip mark count for a single rank. The improved data protection is applied across each rank in the system and prevents uncorrectable errors in situations where a larger number of memory chips fail than can be safely corrected using ECC and CRC alone. In additional embodiments the channel marking may be determined using multiple ranks based on the number of bad chips in all of the ranks.

As used herein, the term "memory channel" refers to a logical entity that is attached to a memory controller and which connects and communicates to registers, memory buffers and memory devices. Thus, for example, in a cascaded memory module configuration, a memory channel would comprise the connection means from a memory controller to a first memory module, the connection means from the first memory module to a second memory module, and all intermediate memory buffers, etc. As used herein, the term "channel failure" refers to any event that can result in corrupted data appearing in the interface of a memory controller to the memory channel. This failure could be, for example, in a communication bus (e.g., electrical, and optical) or in a device that is used as an intermediate medium for buffering data to be conveyed from memory devices through a communication bus, such as a memory hub device. The CRC referred to herein is calculated for data retrieved from the memory chips (also referred to herein as memory devices) and checked at the memory controller. In the case that the check does not pass, it is then known that a channel failure has occurred. An exemplary embodiment described herein applies to both the settings in which a memory buffer or hub device that computes the CRC is incorporated physically in a memory module as well as to configurations in which the memory buffer or hub device is incorporated to the system outside of the memory module.

The capabilities of ECC and CRC are used to detect and correct additional memory device failures occurring coincident with a memory channel failure and up to two additional chip failures. An embodiment includes a five channel RAIM that implements channel CRC to apply temporary marks to failing channels. In an embodiment, the data are stored into all five channels and the data are fetched from all five channels, with the CRC being used to check the local channel interfaces between a memory controller and cascaded memory modules. In the case of fetch data, if a CRC error is detected on the fetch (upstream), the detected CRC error is used to mark the channel with the error, thus allowing better protection/correction of the fetched data. This eliminates the retry typically required on fetches when errors are detected, and allows bad channels to be corrected on the fly without the latency cost associated with a retry. An embodiment as described herein can be used to detect and correct one failing memory channel coincident with up to two memory device failures occurring on one or two of the other memory modules (or channels).

In an embodiment, memory scrubbing is run on the machine. Memory scrubbing is a process that verifies the integrity of the data in the memory chips. Chip counts are accumulated for all chips in a rank.

In an embodiment, if the number of chip marks exceeds a threshold, and if there are no existing channel marks, the channel that has the most chip defects will be marked. The previous chip marks can be freed up or remain. The additional channel mark protects that channel against more DRAM failures within that channel. In an additional embodiment, a calibration process may detect errors and mark chips or channels accordingly.

In an embodiment ECC code supports marking of up to two chips per rank. In addition the ECC code supports marking a channel so that a future decode by the ECC code will not falsely use any data from the marked channel for future corrections.

In an embodiment, once three or more chips are determined to be bad, the scrub marking code will select the channel with the highest number of chip marks and set a channel mark. In an embodiment the channel mark applies to all ranks within a memory subsystem. In an embodiment, when the channel has been marked, the ECC code still supports marking of two additional chips, and detection of a third bad chip.

In an additional embodiment, when there is a periodic calibration that causes interfaces to be marginally working (i.e. a transient, or temporary errors), an error indication occurs. Some calibration errors cause data errors. Since these catastrophic errors can occur as a result of a bad calibration, the calibration status within a channel can be used to immediately mark that channel so the errors that result can be corrected.

FIG. 1 illustrates a block diagram of a cascade interconnect memory system that may be implemented by an embodiment. The memory system depicted in FIG. 1 includes multiple independent memory interface busses 110 that are logically aggregated together to operate in unison to support a single independent access request from a memory controller 102. The servicing of the single independent access request includes data and error detection/correction information distributed or "striped" across the memory interface busses 110 and associated memory devices located on the memory modules 104 by a RAIM module 108. The RAIM module 108 coordinates the striping of data and ECC across each of the parallel memory interface buses 110. An embodiment also includes CRC error detection being performed on data being transferred on the memory interface busses 110 between the memory controller 102 and the memory modules 104.

As shown in the embodiment depicted in FIG. 1, the memory controller 102 attaches to five narrow/high speed point-to-point memory interface busses 110, with each of the memory interface buses 110 connecting one of five memory controller interface channels to a cascade interconnect memory module 104 (or memory subsystem). In an embodiment, each memory module 104 includes at least one hub device 114 and one or more memory devices. As depicted in FIG. 1, the memory interface busses 110 operate in unison to support an access request from the memory controller. In an exemplary embodiment, there may exist a multiplicity of outstanding fetch and store requests to the multiple cascades in the memory subsystem.

Each of the memory interface buses 110 in the embodiment depicted in FIG. 1 includes an upstream bus 112 and a downstream bus 106. One of the functions provided by the memory modules 104 (e.g., a hub device 114 located on the memory module 104) is a re-drive function to send signals on the upstream bus 112 to the memory controller 102 or on the downstream bus 106 to other memory modules 104. In an embodiment, up to two memory modules 104 are cascade connected to each of the memory interface buses 110. In an embodiment, the memory interface buses 110 are implemented using differential clock and data signals (i.e., each clock and data signal requires two wires). In an embodiment, the downstream bus 106 includes thirty-two wires to support: one clock signal, thirteen data/command signals (or bits), one spare clock lane, and one spare data/command lane. In this embodiment, each data packet is transferred over the downstream bus 106 in twelve beats and includes eighteen CRC bits. In an exemplary embodiment, the upstream bus 112 includes forty-six wires to support: one clock signal, twenty data/command signals, one spare clock lane, and one spare data/command lane. In this embodiment, each data packet is transferred over the upstream bus 112 in eight beats and includes sixteen CRC bits.

As used herein, the term "RAIM" refers to redundant arrays of independent memory modules (e.g., dual in-line memory modules or "DIMMs). In a RAIM system, if one of the memory channels fails (e.g, a memory module in the channel), the redundancy allows the memory system to use data from one or more of the other memory channels to reconstruct the data stored on the memory module(s) in the failing channel. The reconstruction is also referred to as error correction.

In an embodiment, the memory system depicted in FIG. 1 is a RAIM memory system and the five channels are lock step channels (i.e., the five memory interface buses 110 are accessed in unison with each other). The RAIM module 108 in this implementation has the property that one of the channel's data is the bitwise XOR of the other four channel's data. Additional checks are included in order to correct for additional errors. As used herein, the term "mark" refers to is an indication given to an ECC that a particular symbol or set of symbols of a read word are suspected to be faulty. The ECC can then use this information to enhance its error correction properties.

As it can be seen from the table in FIG. 5, in an embodiment, when a channel mark is placed, the RAIM ECC can correct at least one unknown bit error (and sometimes an entire unknown chip error), depending on how many additional chip marks (suspected chip errors) are in place. However, without a channel mark, a pattern with a channel error and a single bit error in another channel will cause an uncorrectable error. In accordance with an exemplary embodiment, if the error is caught by the channel CRC, then a temporary mark can be placed which will allow the RAIM ECC to correct additional possible errors. Memory channel failure may require replacement, but the integrity of the concurrently accessed data is not destroyed (i.e., the error is a correctable error or a "CE") by the failure of a single memory channel. Upon memory channel failure, any subsequent reads are calculated from the distributed parity such that the memory channel failure is masked from the end user (i.e., the marked memory channel is ignored).

As used herein, the term "correctable error" or "CE" refers to an error that can be corrected while the system is operational, and thus a CE does not cause a system outage. As used herein, the term "uncorrectable error" or "UE" refers to an error that cannot be corrected while the memory system is operational, and thus presence of a UE may cause a system outage, during which time the cause of the UE can be corrected (e.g., by replacing a memory device, by replacing a memory module, recalibrating an interface).

As used herein, the term "coincident" refers to the occurrence of two (or more) error patterns or error conditions that overlap each other in time. In one example, a CE occurs and then later in time, before the first CE can be repaired, a second failure occurs. The first and second failure are said to be coincident. Repair times are always greater than zero and the longer the repair time, the more likely it would be to have a second failure occur coincident with the first. Some contemporary systems attempt to handle multiple failing devices by requiring sparing a first device or module. This may require substantially longer repair times than simply using marking, as provided by exemplary embodiments described herein. Before a second failure is identified, embodiments provide for immediate correction of a memory channel failure using marking, thus allowing an additional correction of a second failure. Once a memory channel failure is identified, an embodiment provides correction of the memory channel failure, up to two marked additional memory devices and a new single bit error. If the system has at most one marked memory device together with the marked channel, then an entire new chip error can be corrected. The words "memory channel failure" utilized herein, includes failures of the communication medium that conveys the data from the memory modules 104 to the memory controller 102 (i.e., through one of the memory interface buses 110), in addition to possible memory hub devices and registers.

Figure 2:
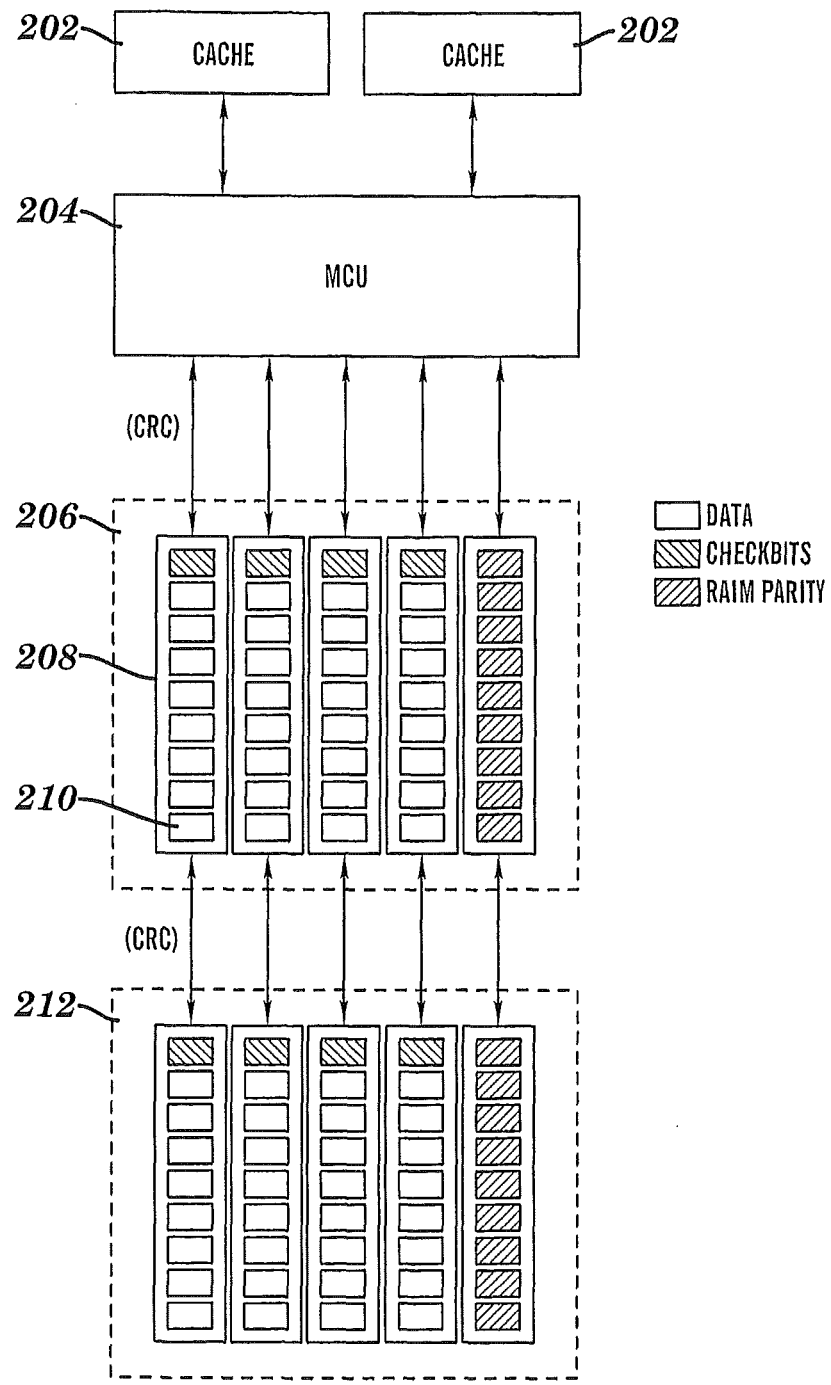
FIG. 2 illustrates a memory system in an embodiment.

FIG. 2 illustrates a memory system in an embodiment. In an embodiment the memory system includes one or more caches 202 in communication with a memory controller unit 204 (MCU). In an embodiment, the MCU 204 is in communication with a rank 206. In additional embodiments, the MCU 204 is in communication with additional ranks such as rank 212 in a cascade as is known in the art. In an embodiment, each rank includes 5 channels and each channel includes a single memory module (also referred to herein as "DIMM") 208. Each DIMM 208 includes one or more memory chips 210. In an embodiment, one DIMM 208 includes RAIM parity data, and one memory chip 210 from each of the other four channels includes checkbits. The parity data and check bits are used for CRC and ECC as is known in the art.

Figure 3:
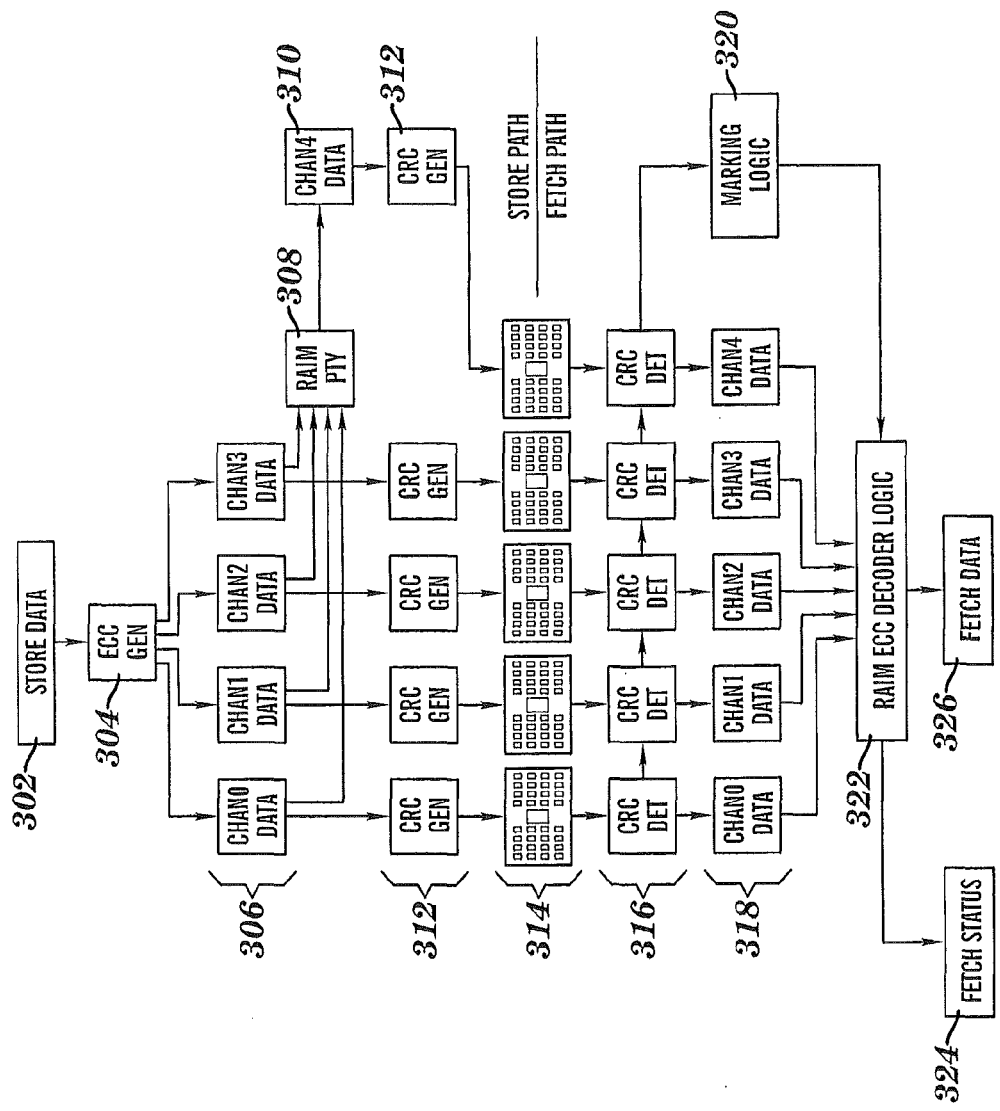
FIG. 3 illustrates a block diagram of a RAIM store and fetch path that implements both ECC and channel CRC that may be implemented by an embodiment.

FIG. 3 illustrates a block diagram of RAIM store and fetch paths that implement both ECC and channel CRC in an embodiment. In an embodiment, the store path is implemented by hardware and/or software located on the memory controller 102. In addition, the store path may be implemented by hardware and/or software instructions located on a memory module 104 (e.g., in a hub device on the memory module). The RAIM configuration depicted in FIG. 3, which includes a memory channel that is dedicated to storing parity information, has some similarities to a RAID 3 configuration (i.e., striped disks with dedicated parity), although as described earlier in reference to FIG. 1, a RAIM ECC code may be implemented that includes additional checks that are stored that allow for functionality well beyond the RAID 3 capabilities. As depicted in FIG. 3, data from the five channels are combined in a way that protects data against loss of any one memory channel (e.g., a memory module 104).

In the RAIM store path depicted in FIG. 3, the ECC generator 304 receives store data 302 and outputs four groupings of channel data 306 that include ECC checkbits. The channel data 306 are input to individual CRC generators 312 and are also input to a RAIM parity generator 308 that outputs RAIM parity bits as channel data 310. The combination of the ECC checkbits and the RAIM parity bits described above are the overall checkbits of the RAIM ECC. The channel data 306 310 are input to the CRC generators 312 to generate CRC bits for the channel data 306 and 310. Output from the CRC generators 312 (including CRC and data bits) are then output to the downstream bus 106 (or channel) for transmission to the memory modules 314. As shown in FIG. 3, the data being stored on the memory modules 314 are supplemented by ECC. In an embodiment, the CRC bits are used for bus protection and are not stored.

In an embodiment, the fetch path is implemented by hardware and/or software located on the memory controller 102. In addition, the fetch path may be implemented by hardware and/or software instructions located on a memory module 104 (e.g., in a hub device on the memory module). As shown in FIG. 3, the RAIM fetch path includes receiving data on an upstream bus 112 from the memory modules 314. The CRC detectors 316 depicted in FIG. 3 are utilized to detect a channel error, and to temporarily mark a failing channel.

Output from the CRC detectors 316 are the channel data 318, which include data and ECC bits that were generated by an ECC generator, such as ECC generator 304. In addition, the CRC detectors 316 output data to the marking logic 320 (also referred to herein as a "marking module") to indicate which channels are in error. In an embodiment the marking logic 320 generates marking data indicating which channels and memory chips (i.e. devices) are marked. The channel data 318 and the marking data are input to RAIM module 322 where channel data 318 are analyzed for errors which may be detected and corrected using the RAIM ECC and the marking data received from the marking logic 320. Output from the RAIM module 322 are the corrected data 326 (in this example 64 bytes of fetched data) and a fetch status 324. Embodiments provide the ability to have soft errors present (e.g., failing memory devices) and also channel failures or other internal errors without getting UEs.

Figure 4:
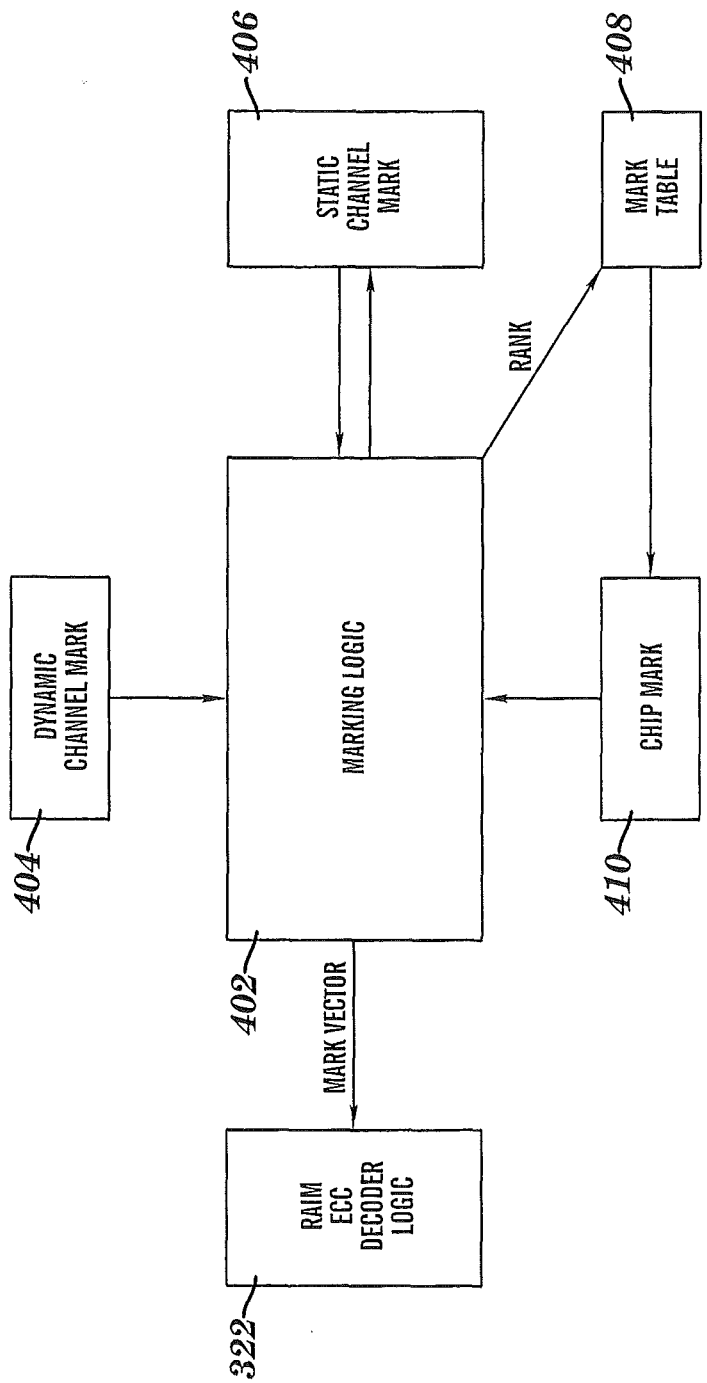
FIG. 4 illustrates a block diagram of the marking logic in an embodiment.

FIG. 4 illustrates a block diagram of the marking logic in an embodiment. In an embodiment, the marking logic illustrated in FIG. 4 is executed in the marking logic 320 of FIG. 3. In an embodiment the marking logic 402 receives dynamic channel marking data 404. In an embodiment the dynamic channel marking data 404 is received from the CRC detectors 316 of FIG. 3. The CRC detectors 316 detect errors at each of the channels and dynamically flag them as faulty until a data recovery occurs. Once data validation and recovery occurs, such as from a scrubbing process, the flags are removed. In an embodiment, the dynamic channel marking data 404 is a vector of bits. In one embodiment the dynamic channel marking data 404 is a 5-bit vector indicating which of the 5 channels have been dynamically marked.

In an embodiment, the marking logic additionally receives static channel mark data 406. The static channel mark data 406 indicates the channels that have permanent errors and need to be replaced. In an embodiment the static channel mark data 406 is updated by marking logic 402. Marking logic 402 can be implemented in hardware, software, firmware, or any combination of hardware, software, or firmware. In an embodiment the mark table 408 tracks all of the chip marks in each rank of the memory.

In an embodiment, the marking logic also receives chip mark data 410. In an embodiment the chip mark data 410 is stored in the mark table 408. In an embodiment of the mark table 408, a rank is supplied to the table to enable look-up of the chip marks. The chip mark data 410 is a vector of data indicating which, if any, chips in the given rank have been marked. In an embodiment, the chip mark data 410 includes an x mark indicating a first marked chip, and a y mark indicating a second marked chip. The marking logic 402 combines the results of all of the data and calculates if any of the channels should be marked. In an embodiment, chip marks are freed up in a marked channel based on logic as will be described in more detail below. If the marking logic 402 calculates that a channel mark is appropriate, it updates the static channel mark table 406. The marking logic 402 sends a mark vector indicating the hardware channels and chips that have been marked to the RAIM ECC decoder logic 322 which uses the data to efficiently correct any errors in the data.

FIG. 5 illustrates a table of error coverage in an embodiment. Notice that, in the absence of any channel marks, all single or double DRAM chip errors isolated to a single channel are always 100% correctable, whether there are single or double DRAM chip marks. However, with some ECC codes, higher numbers of DRAM chip errors in an unmarked channel can cause UEs, even if entirely in a channel. For instance, there are some types of 5, 6, 7, 8, and 9 chip failures that can cause UEs in a channel. An embodiment of the invention is to use voting to determine the channel that is most likely to have the most defective chips.

FIG. 6A illustrates entries in a marking table in an embodiment. The marking table includes entries for each slot and rank within the slot. For each slot and rank, the data is stored that indicates the channel and chip that has been marked. In an embodiment, the first four nibbles (16 bits) of data store the hardware location of the x mark, the second four nibbles (16 bits) of data store the hardware location of the y mark. In an embodiment the hardware location of the x and y marks is determined based on a hardware table as illustrated in FIG. 6B. These tables are based on the ECC codes themselves and can be determined based on how the chip marks are mapped to actual data that are stored. For example slot 1, rank 0 of port 0 shows an x mark at 1F38, and a Y mark at 851F. The hardware table of FIG. 6B indicates that the x mark is for chip 6 located on channel 3 and the y mark is for chip 6 on channel 0. In one embodiment, a single mark table is used to store all entries across all ports. In additional embodiments, the entries may be stored in separate tables for each port. It will be understood that the mark tables may be implemented in hardware, software, or a combination of hardware and software. In addition, it will be understood that the hardware lookup table of FIG. 6B may be implemented in hardware, software, or a combination of hardware and software.

It will be understood that the specific values and diagrams are non-limiting examples used for purposes of clarity. In additional embodiments, other values and/or methods of storage may be used. In an embodiment, additional data may be stored in the additional bits of the data field.

Figures 7A, 7B:
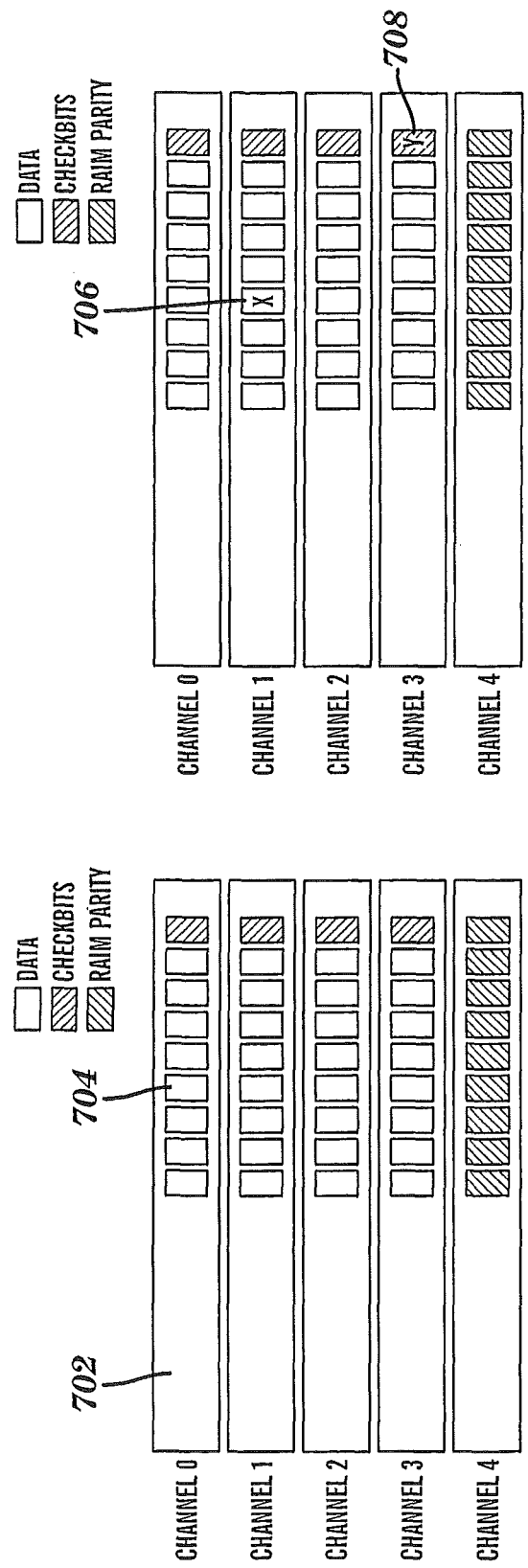
FIG. 7A illustrates a memory rank with 5 channels.
FIG. 7B illustrates a memory rank with 5 channels and two marked chips in an embodiment.

FIG. 7A illustrates a memory rank with 5 channels. Each channel includes a memory module 702, and each memory module includes a plurality of ranks, each with 9 memory chips 704. FIG. 7A depicts one embodiment with four channels that include 9 memory chips each, which store normal data and one memory chip which stores checkbits. In the same embodiment, a fifth channel stores RAIM parity across the other channels. FIG. 7B additionally illustrates a memory rank with 5 channels. The memory rank of FIG. 7B includes two marked memory chips. The fourth chip in channel 1 has an X mark, and the 9th chip in channel 3 has a Y mark. In an embodiment, the marks can be made in any of the chips on any of the channels including the parity bits of channel 4, and the checkbits of any of the channels. In an embodiment, all marking is performed by marking logic 320. Also, regardless of the marking used for fetching, in an embodiment, the store path will continue to store to all 45 chips in the rank. In another embodiment, the store path will block writing to a marked channel.

Figure 8:
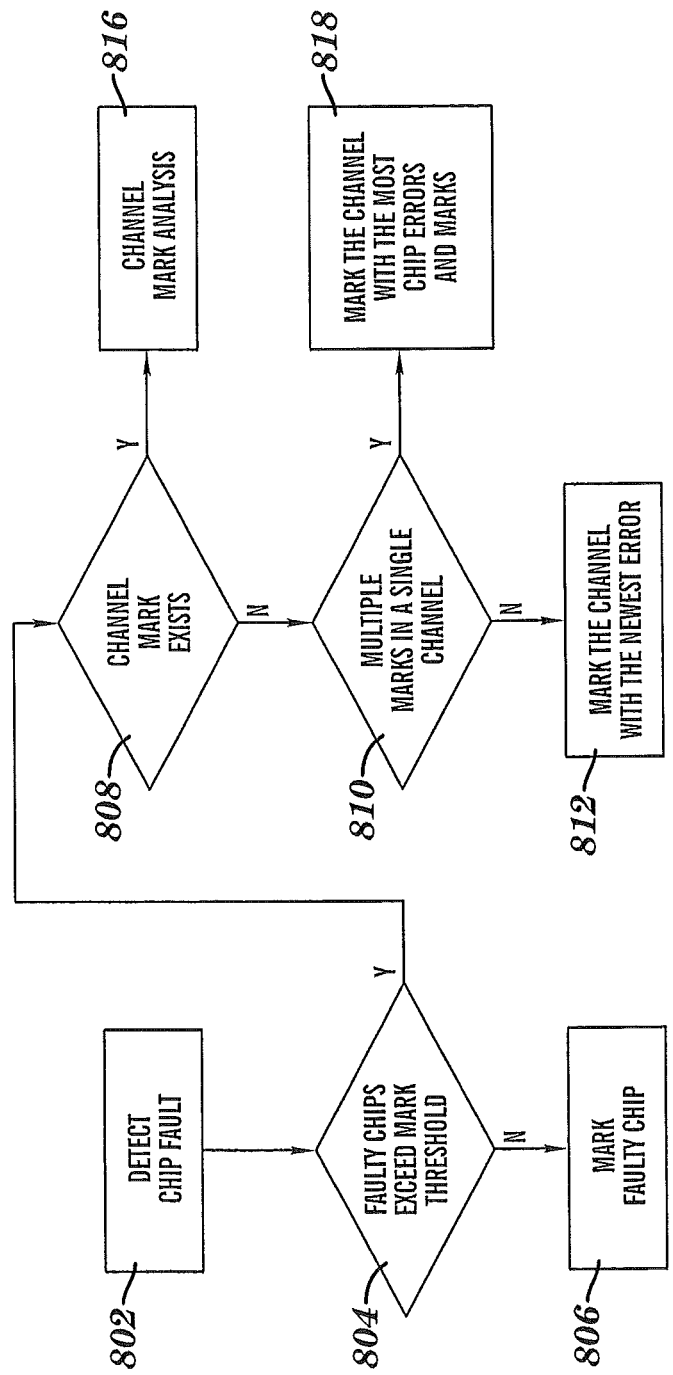
FIG. 8 illustrates a process flow of channel marking in the event of a chip mark overflow in an embodiment.

FIG. 8 illustrates a process flow of channel marking in the event of a chip mark overflow in an embodiment. The process flow of FIG. 8 is executed in the marking logic 320 of FIG. 3 in an exemplary embodiment. At block 802 a faulty chip is detected. In an embodiment, the faulty chip is detected during a memory scrub operation. In an additional embodiment the faulty chip is detected when the memory controller or RAIM logic polls a hub in a memory module. In yet another embodiment the faulty chip is detected during a polling process. Polling is a process in which the hardware and/or software can read error statuses from a memory controller or hub hardware. In an embodiment, the polling is done in a running system via mainline, inband connections or via out-of-band control packet transfers. In an embodiment, calibration data is read from the hub chip by software using hardware polling. If there are calibration errors in a particular channel and there are no channel marks present, a channel mark is made for that channel, regardless of whether there were any previous chip marks in any of the ranks. In an embodiment, during calibration the DRAM interface traffic is quiescent and delays or levels are adjusted in order to improve margin on the interface to compensate for voltage and timing drift. Error detection is also performed and can result in an error indicator if there is a severe interface problem. The process of marking a channel based on calibration errors is a pro-active way to mitigate risks of many errors in a channel eventually becoming uncorrectable. At block 804, if the faulty chip count does not exceed a maximum chip mark threshold, the chip is marked at block 806. Once marked, a channel or chip mark will be supplied to the RAIM module 322 of FIG. 3. In an embodiment, if the faulty chips in the rank exceed the number of available marks processing continues at block 808. In an embodiment, a call home will be issued indicating that the number of available marks have been exceeded. At block 808, if a channel mark already exists, channel mark analysis is done at block 816. In an embodiment at block 816, no action is taken and the RAIM ECC proceeds to correct errors to the best of its ability with existing marking. In another embodiment, channel marks are re-evaluated to see if there is a channel that has more chips than the previously marked channel. If a channel mark does not currently exist, processing continues at block 810. At block 810, if there are multiple faulty chips (i.e. existing marks or new faulty chips) in a single channel, the channel with the multiple faulty chips is marked at block 818. In an embodiment, the channel with the most faulty chips in the rank is marked. In another embodiment, the channel with the most faulty chips across all the ranks is marked. Returning to block 810, if the faulty chips are all spread across different channels (i.e. no channel has more than one faulty chip), in an embodiment, the channel in which the newest faulty chip was discovered is marked at block 812. In another embodiment, no channel mark is performed at block 812.

In an embodiment, when a channel is marked, it is permanently marked. When a channel is permanently marked, any additional writes to that channel are ignored. Therefore, if a channel is permanently marked, the data in the channel becomes stale, and as a result the mark cannot be removed until the memory module in that channel is replaced. In additional embodiments, a process is executed to scrub or cleanup the permanently marked channel. This is often done by a scrubbing processing. In additional embodiments, a channel may be marked only for fetches. If a channel is marked for fetches, all subsequent writes to the channel are allowed, however, when data is read, the data in the marked channel is ignored. When the channel is marked using a fetch-based mark, subsequent operations may move the mark to another channel, or remove the mark if it is determined that the chips in that channel are no longer generating errors.

Figure 9:
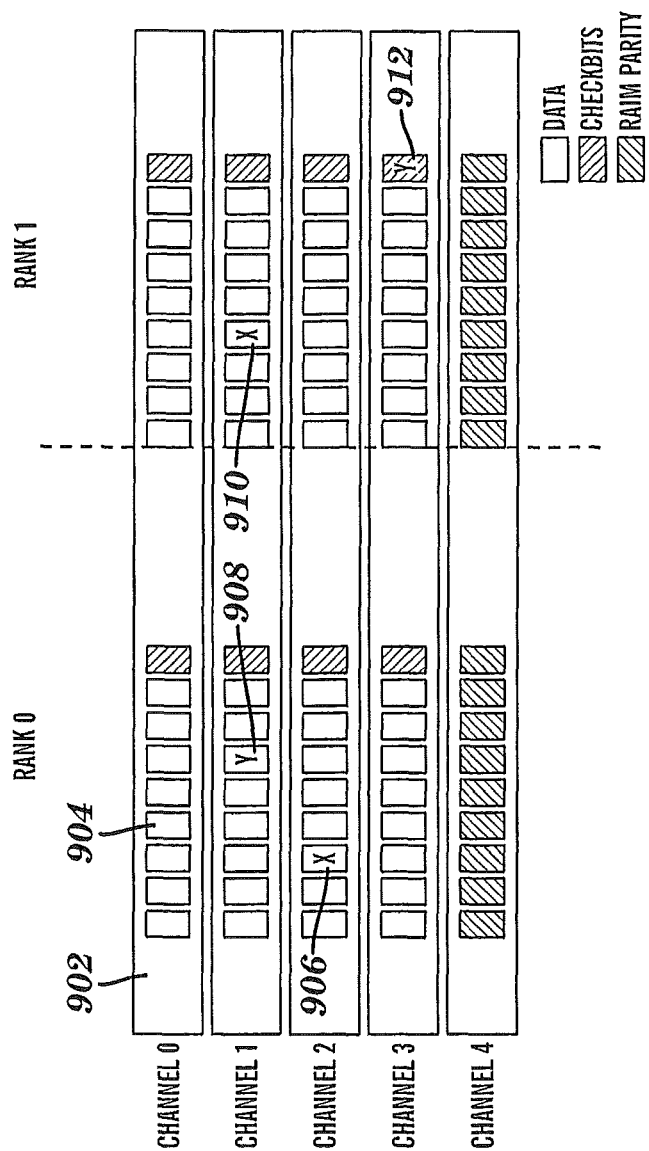
FIG. 9 illustrates a cross-rank marking case for a memory with two ranks in an embodiment.

In additional embodiments, a channel is marked based on calculations across all of the ranks. For instance, FIG. 9 illustrates a cross-rank marking for a memory with two ranks, Rank 0 and Rank 1 in an embodiment. There is one DIMM 902 per channel with a multiplicity of DRAM chips 904 in each rank. In an exemplary embodiment, Rank 0 has two chip marks: an X mark 906 and a Y mark 908. Rank 1 has two chip marks: an X mark 910 and a Y mark 912. Considering only a single rank at a time, there are no channels which would be marked while following the flowchart in FIG. 8. However, when considering all ranks, Rank 0 Y mark 908 and Rank 1 X mark 910, considered together will indicate that channel 1 has two bad chips and channel 1 will be marked with a channel mark in an embodiment which considers a plurality of ranks together.

Technical effects and benefits include the ability to run a memory system in an unimpaired state with more than the maximum chip level failures by optimally marking a channel thereby releasing at least one chip mark. This may lead to significant improvements in memory system availability and serviceability.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As described above, embodiments can be embodied in the form of computer-implemented processes and apparatuses for practicing those processes. In exemplary embodiments, the invention is embodied in computer program code executed by one or more network elements. Embodiments include a computer program product on a computer usable medium with computer program code logic containing instructions embodied in tangible media as an article of manufacture. Exemplary articles of manufacture for computer usable medium may include floppy diskettes, CD-ROMs, hard drives, universal serial bus (USB) flash drives, or any other computer-readable storage medium, wherein, when the computer program code logic is loaded into and executed by a computer, the computer becomes an apparatus for practicing the invention. Embodiments include computer program code logic, for example, whether stored in a storage medium, loaded into and/or executed by a computer, or transmitted over some transmission medium, such as over electrical wiring or cabling, through fiber optics, or via electromagnetic radiation, wherein, when the computer program code logic is loaded into and executed by a computer, the computer becomes an apparatus for practicing the invention. When implemented on a general-purpose microprocessor, the computer program code logic segments configure the microprocessor to create specific logic circuits.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer implemented method comprising:
detecting whether a chip error has occurred in one of a plurality of memory chips in a first memory channel of a plurality of memory channels, the detecting spanning across at least one rank of the plurality of memory channels, and generating chip mark data based on the chip error occurring;
receiving, by a marking module, the chip mark data;
determining whether a number of chip errors in the at least one rank exceeds a chip mark threshold based on the chip mark data and a mark table of the marking module, wherein the chip mark threshold comprises a number of available chip marks in the mark table;
based on determining that the number of chip errors in the at least one rank exceeds the chip mark threshold, determining whether one of the plurality of memory channels comprises a marked channel;
based on determining that none of the plurality of memory channels comprises a marked channel, determining, based on the mark table, whether there are multiple chip marks in any channel of the plurality of memory channels; and
based on determining that there are not multiple chip marks in any channel of the plurality of memory channels, marking the first channel as a marked channel.

2. The method of claim 1, further comprising, based on determining that there are multiple chip marks in at least one channel of the plurality channels, marking the one of the plurality of memory channels having a greatest number of chip marks as a marked channel.

3. The method of claim 1, wherein a channel is marked with a permanent channel mark based on the number of chip marks exceeding the chip mark threshold.

4. The method of claim 1, wherein a channel is marked with a fetch mark based on the number of chip errors exceeding the chip mark threshold.

5. The method of claim 1, wherein the marking comprises marking one of the plurality of memory channels as a marked channel based on a memory scrub operation.

6. The method of claim 1, wherein the marking comprises marking one of the plurality of memory channels as a marked channel based on polling a hub device on one of a plurality of memory devices, the plurality of memory devices comprising the memory chips.

7. The method of claim 1, wherein the marking comprises selecting one of the plurality of memory channels to mark as a marked channel based on a calculation of marked chips across multiple ranks of memory.

8. The method of claim 1, wherein the channel marking data is static channel marking data that causes a marked channel to be de-allocated.

9. The method of claim 1, wherein the channel marking data is dynamic channel marking data.

10. The method of claim 3, further comprising ignoring writes to the marked channel based on the channel being marked with the permanent channel mark.

11. The method of claim 4, comprising allowing all subsequent writes to the channel that is marked with the fetch mark, and ignoring data fetched from the channel based on the channel being marked with the fetch mark.

* * * * *